(12) United States Patent
Kawasumi

(10) Patent No.: US 8,223,581 B2
(45) Date of Patent: Jul. 17, 2012

(54) SEMICONDUCTOR STORAGE DEVICE

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 12/645,397

(22) Filed: Dec. 22, 2009

(65) Prior Publication Data

US 2010/0165697 A1  Jul. 1, 2010

(30) Foreign Application Priority Data

Dec. 25, 2008  (JP) ................................. 2008-329774

(51) Int. Cl.
*G11C 8/08* (2006.01)
*G11C 11/00* (2006.01)

(52) U.S. Cl. .................... 365/230.06; 365/154

(58) Field of Classification Search ............. 365/230.06, 365/154, 230.05

See application file for complete search history.

(56) References Cited

U.S. PATENT DOCUMENTS 5,886,939 A * 3/1999 Choi et al. ............... 365/210.15
6,252,814 B1 * 6/2001 Tran et al. ................... 365/210.1
6,977,834 B2 * 12/2005 Onizawa et al. ............... 365/63

OTHER PUBLICATIONS

K.Ishibashi et al., "A 1-V TFT-Loard SRAM Using a Two-Step Word-Voltage Method," IEEE Journal of Solid-State Circuits, vol. 27, No. 11, pp. 1519-1524 Nov. 1992.

* cited by examiner

*Primary Examiner* — Anh Phung
(74) *Attorney, Agent, or Firm* — Knobbe, Martens, Olson & Bear, LLP

(57) ABSTRACT

A semiconductor storage device includes: a memory cell array including a plurality of first wirings, a plurality of second wirings intersecting with the first wirings, and a plurality of memory cells respectively arranged at intersections of the first and second wirings; a plurality of drivers that drive the first wirings; a dummy wiring continuously extending in a direction of the first wirings and in a direction of the second wirings, a part of the dummy wiring extending in the direction of the second wirings being connected to the plurality of drivers; a plurality of switch circuits connected to respective connection portions of the plurality of drivers and the dummy wiring; and a replica line extending in the direction of the second wirings and connected to the dummy wiring through the plurality of switch circuits.

14 Claims, 4 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2008-329774, filed on Dec. 25, 2008, the entire contents of which are incorporated herein by reference.

BACKGROUND OF THE INVENTION

1. Field of the Invention

The invention relates to a semiconductor storage device and particularly to an SRAM and the like.

2. Description of the Related Art

In order to lower the power consumption of an LSI, there is a demand of lowering power source voltage. The lower limit of the power source voltage of an LSI is often determined by an SRAM in the LSI. This is due to the disturb problem of a memory cell. Specifically, in a conventional six-transistor memory cell, when a word line is selected for a read operation, a pre-charged bit line is connected to an internal node, which forms a flip-flop circuit, through a transfer transistor, so that the internal node is slightly charged. Accordingly, data of the flip-flop circuit become unstable and data corruption is caused when the power source voltage is lowered. To address such a disturb problem, there is a method in which a selection level of the word line is raised from a non-selective level to a selective level in stages. With this method, when a level of the word line is at an intermediate level, a driving force of a transfer transistor is small, so that an influence of the bit line on the internal node can be suppressed (Document 1: A 1-V TFT-Load SRAM Using Two-Step Word-Voltage Method, Koichiro Ishibashi et. al., IEEE JOURNAL OF SOLID-STAGE CIRCUITS, VOL. 27, No. 11, NOVEMBER 1992).

However, it is difficult to increase the selection level of the word line in stages by a single power source and with a small area overhead. Further, there is a problem that circuit constants have to be adjusted according to a scale of a cell array.

SUMMARY OF THE INVENTION

A semiconductor storage device according to an aspect of the invention includes: a memory cell array including a plurality of first wirings, a plurality of second wirings intersecting with the first wirings, and a plurality of memory cells respectively arranged at intersections of the first and second wirings; a plurality of drivers that drive the first wirings; a dummy wiring continuously extending in a direction of the first wirings and in a direction of the second wirings, a part of the dummy wiring extending in the direction of the second wirings being connected to the plurality of drivers; a plurality of switch circuits connected to respective connection portions of the plurality of drivers and the dummy wiring; and a replica line extending in the direction of the second wirings and connected to the dummy wiring through the plurality of switch circuits.

A semiconductor storage device according to another aspect of the invention includes: a memory cell array including a plurality of word lines, a plurality of bit line pairs which intersect with the word lines and each of which includes a plurality of first and second bit lines, and a plurality of memory cells respectively arranged at intersections of the word lines and the bit line pairs; a plurality of drivers that drive the word lines; a dummy wiring continuously extending in a direction of the word lines and in a direction of the bit line pairs, a part of the dummy wiring extending in the direction of the bit line pairs being connected to the plurality of drivers; a plurality of switch circuits connected to respective connection portions of the plurality of drivers and the dummy wiring; and a replica line extending in the direction of the bit line pairs and connected to the dummy wiring through the plurality of switch circuits. Each of the memory cells includes: first and second inverters, input ends and output ends of which are connected to each other; a first transfer transistor which is connected between the output end of the first inverter and each of the first bit lines, and a gate of which is connected to each of the word lines; and a second transfer transistor which is connected between the output end of the second inverter and each of the second bit lines and a gate of which is connected to each of the word lines.

A semiconductor storage device according to still another aspect of the invention includes: a memory cell array including a plurality of first wirings, a plurality of second wirings intersecting with the first wirings, and a plurality of memory cells respectively arranged at intersections of the first and second wirings; a plurality of drivers that drive the first wirings; a dummy wiring including a first partial dummy wiring having a length corresponding to the first wirings and a second partial dummy wiring connected to the plurality of drivers and having a length corresponding to a width of a wiring area, in which the plurality of drivers are arranged, in the direction of the second wirings; and a replica line having a length corresponding to the second partial dummy wiring. Upon data write to the memory cells, a charge share of a voltage of the dummy wiring occurs between one of the first wirings and the first partial dummy wiring and between the second partial dummy wiring and the replica line.

DETAILED DESCRIPTION OF THE EMBODIMENTS

Hereinafter, embodiments of a semiconductor storage device according to the invention will be described in detail referring to the accompanying drawings.

[First Embodiment]

Figure 1:
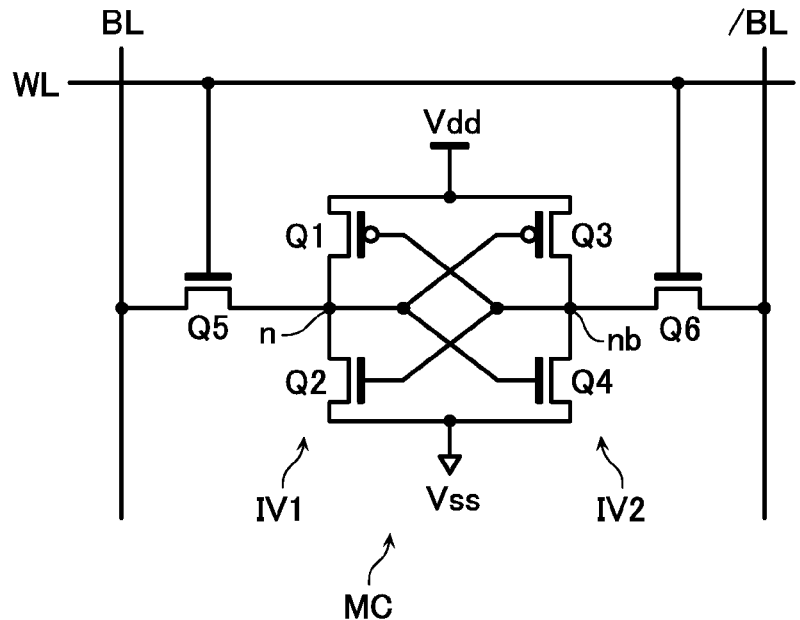
FIG. 1 is a circuit diagram of a memory cell of a semiconductor storage device according to a first embodiment of the invention.

FIG. 1 is a circuit diagram of a memory cell MC of a semiconductor storage device according to an embodiment of the invention.

The memory cell MC is a six-transistor memory cell as shown in FIG. 1, for example. Specifically, the six-transistor memory cell includes: a first inverter IV1 having a PMOS transistor Q1 and an NMOS transistor Q2, sources of which are respectively connected to a power source line Vdd and a ground line Vss and which are connected to be a complementary pair; and a second inverter IV2 having a PMOS transistor Q3 and an NMOS transistor Q4, sources of which are respectively connected to the power source line Vdd and the ground line Vss and which are connected to be a complementary pair. Inputs and outputs of these inverters IV1 and IV2 are connected to each other. A first transfer transistor Q5 is connected between a first bit line BL as one of second wirings and the output of the first inverter IV1 and a second transfer transistor Q6 is connected between a second bit line /BL as another one of the second wirings and the output of the second inverter IV2. Gates of the first and second transfer transistors Q5 and Q6 are connected to a word line WL that is a first wiring.

Note that the voltage Vdd may be described as "H" and the voltage Vss may be described as "L" in the description hereinafter.

Next, an operation of the memory cell MC will be described.

Before describing this embodiment, a conventional data read/write operation will be briefly described.

Here, it is assumed that a node n on the bit line BL side of the memory cell MC is kept at "H" and a node nb on the bit line /BL side is kept at "L".

Data read from the memory cell MC is performed as follows.

Before the data read, the bit lines BL and /BL are pre-charged to "H" by a pre-charge circuit, which is not shown.

In this state, when a word line WL is selected and charged to "H", the transfer transistors Q5 and Q6 are turned on. In this case, the voltage of the bit line /BL is pulled down to "L" through the NMOS transistor Q4 that is turned on due to "H" held by the node n. On the other hand, the bit line BL is kept at "H".

Data emerged on these bit lines BL and /BL are detected and amplified by a sense amplifier circuit, which is not shown, whereby the data read is completed.

On the other hand, data write to the memory cell MC is performed as follows.

In the data write, data intended to be written in the nodes n and nb are respectively written to the bit lines BL and /BL of the memory cell MC from a circuit, which is not shown. Here, it is assumed that "L" is written to the bit line BL and "H" is written to the bit line /BL.

In this state, when a word line WL is selected and charged to "H", the transfer transistors Q5 and Q6 are turned on. As a result, the node n transits from "H" to "L" and the node nb transits from "L" to "H".

Accordingly, the data write is completed.

However, practically, the characteristics of the transistors constituting the memory cell MC vary and the following problems occur depending on how their characteristics vary.

Specifically, during data read, if a driving force of the transfer transistor Q6 is large and that of the driving transistor Q4 is small in a specific memory cell MC, there occurs a risk that a datum kept at the node nb is inverted to "H" due to an influence by the bit line /BL before the bit line /BL is pulled down from "H" to "L". Considering such a problem, it is preferable that the driving force of the driving transistor Q4 is larger than that of the transfer transistor Q6 regarding the data read.

On the other hand, during data write, if a driving force of the transfer transistor Q6 is small and that of the driving transistor Q4 is large in a specific memory cell, there occurs a risk that the bit line /BL is pulled down to "L" due to an influence by the driving transistor Q4 having a large driving force before the datum of the node nb transits from "L" to "H". Considering such a problem, it is preferable that the driving force of the transfer transistor Q6 is larger than that of the driving transistor Q4 regarding the data write.

As apparent from the foregoing, in order to perform the data read and the data write more securely, transistors having competing characteristics are prepared, which is difficult to realize.

Figure 2:
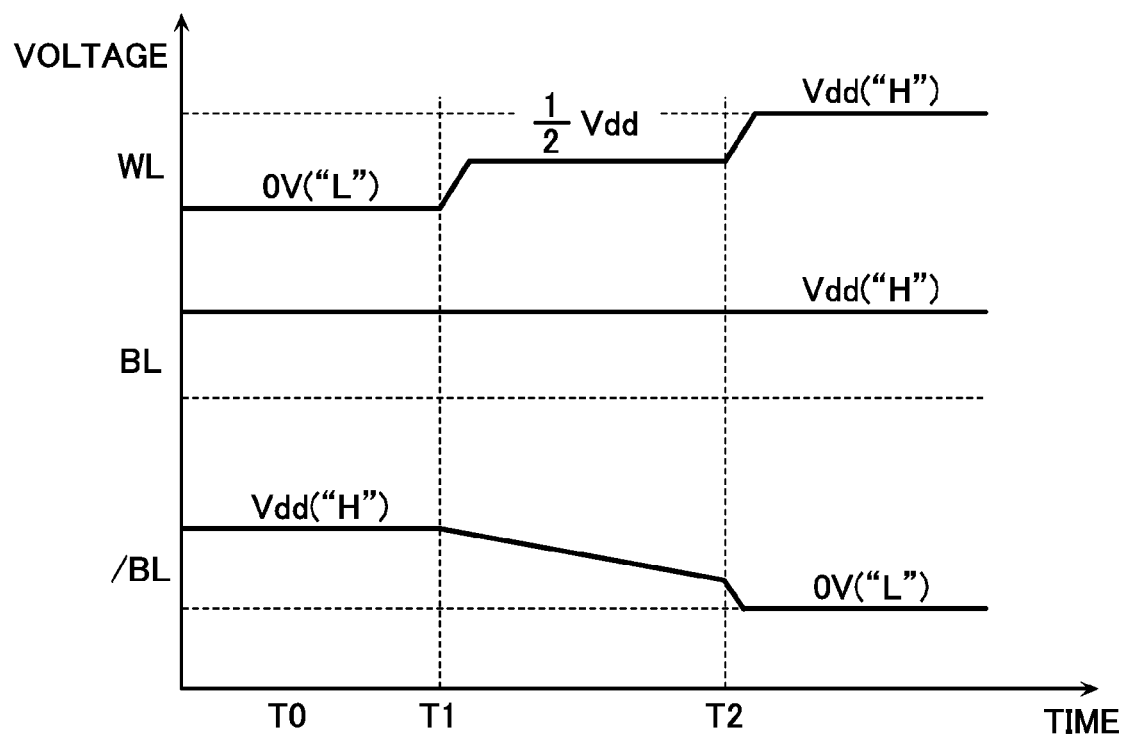
FIG. 2 shows an operation waveform of the memory cell of the semiconductor storage device.

Therefore, in this embodiment, the data read/write with respect to the memory cell MC is realized by an operation waveform as shown in FIG. 2.

At first before data read (at a time T0), the word line WL is at "L" since it is not selected and the bit lines BL and /BL are at "H" since they are pre-charged.

Subsequently, the word line WL is selected at a time T1. At this time, a voltage of a level between 0 V and the voltage Vdd, 1/2×Vdd, for example, is supplied to the word line WL. As a result, the transfer transistors Q5 and Q6 are turned on by a small driving force, so that the level of the bit line /BL gradually transits to "L". By decreasing the driving force of the transfer transistors Q5 and Q6 as described above, an influence of the levels of the bit lines BL and /BL on the nodes n and nb can be suppressed.

Subsequently, at a time point when the level of the bit line /BL is lowered to some extent (at a time T2), the level of the word line WL is pulled up to the voltage Vdd. As a result, the driving forces of the transfer transistors Q5 and Q6 become larger, and thus the bit line /BL is pulled down to "L" at once.

By making the operation waveform of the word line WL in stages as described above, data corruption upon the data read from the memory cell MC can be suppressed. In addition, the driving forces of the transfer transistors Q5 and Q6 are sufficiently large at the time T2 or later, so that the data write can be also performed without any difficulties.

Next, a circuit configuration for generating the operation waveform shown in FIG. 2 will be described.

Figure 3:
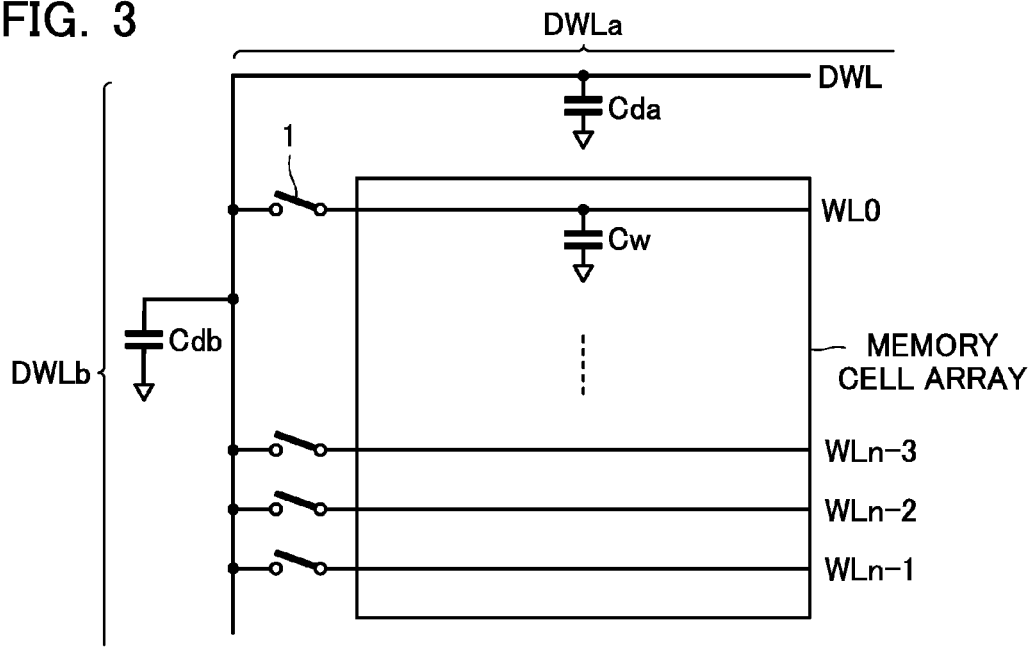
FIG. 3 is a schematic diagram showing a part of the semiconductor storage device.

FIG. 3 is a schematic diagram showing a part of the semiconductor storage device according to this embodiment. For simplicity, the bit lines BL and /BL and the memory cell MC are not shown.

This circuit includes a memory cell array having n word lines WL0 to WLn−1, a plurality of bit lines BL and /BL intersecting with these word lines WL and a plurality of memory cells MC respectively arranged at intersections of the word lines WL and the bit lines BL and /BL. The plurality of word lines WL respectively have parasitic capacitances Cw.

In addition, this circuit includes a dummy word line DWL as a dummy wiring. The dummy word line DWL is formed to include a first partial dummy word line DWLa extending in a direction of the word lines WL and a second partial dummy word line DWLb extending in a direction of the bit lines BL, both of which are continuously formed. The part of the dummy word line DWLb in the dummy word line DWL is connected to the word lines WL through switch circuits 1 respectively provided at ends of the word lines WL.

Here, the first partial dummy word line DWLa is formed similarly to the word lines WL, so that its parasitic capacitance Cda becomes almost the same as the parasitic capacitance Cw of the word lines WL.

Next, the way of supplying a voltage of 1/2×Vdd to the word lines WL by using the circuit configuration will be described.

A level of the dummy word line DWL is previously charged to the voltage Vdd before a word line WL is selected. Subsequently, at the same time as a specific word line WL is selected, a switch circuit 1 provided at an end of the word line WL is turned on. Accordingly, a charge share occurs between a parasitic capacitance Cd of the dummy word line DWL and the parasitic capacitance Cw of the word line WL. In this case, the levels of the dummy word line DWL and the word line WL are in equilibrium, whereby the level of the word line WL becomes 1/2×Vdd.

However, practically, the dummy word line DWL has a parasitic capacitance Cdb of the partial dummy word line DWLb as well as the parasitic capacitance Cda of the partial dummy word line DWLa. Therefore, in order to make the level of the word line WL at 1/2×Vdd, the parasitic capacitance Cdb also has to be considered. However, the parasitic capacitance Cdb varies according to a position of a word line WL to be selected.

Therefore, the semiconductor storage device of this embodiment further includes a replica line RL and a dummy driver 3 in addition to the dummy word line WL.

Figure 4:
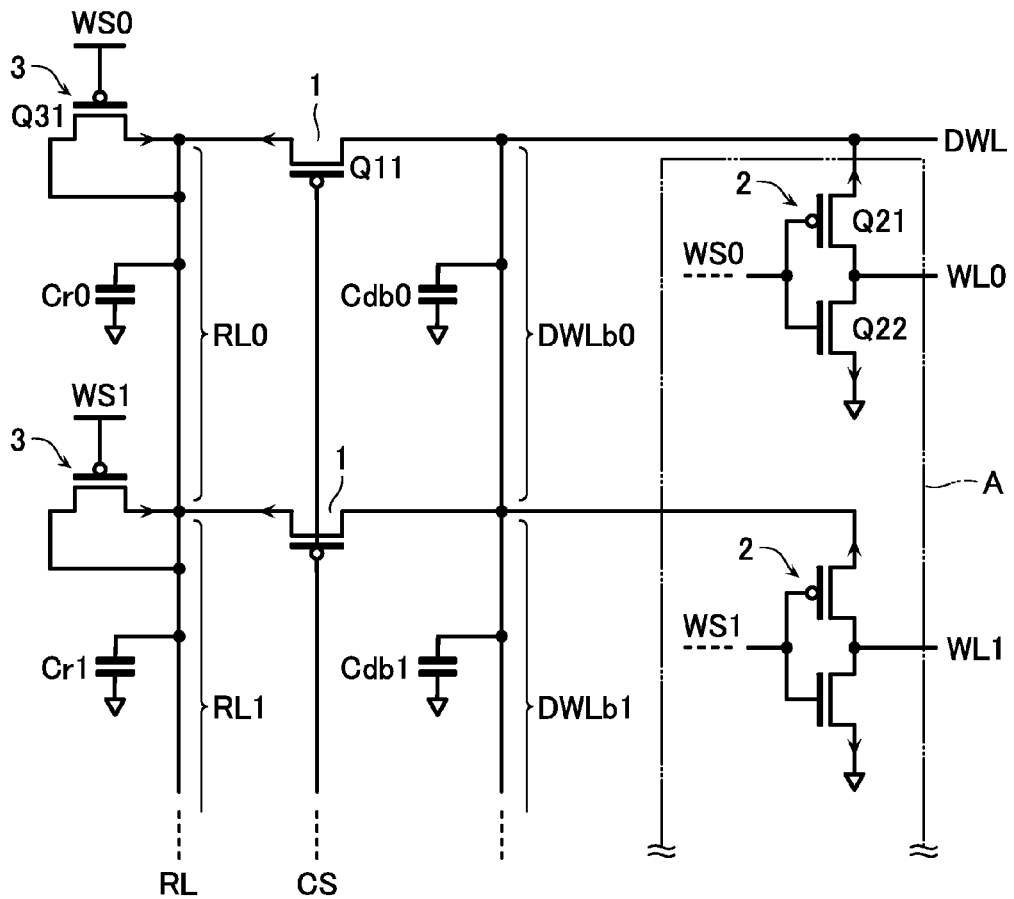
FIG. 4 is a circuit diagram showing a part of the semiconductor storage device.

FIG. 4 is a circuit diagram showing a part of the semiconductor storage device according to this embodiment.

This circuit includes a dummy word line DWL and a plurality of word lines WL0, WL1, . . . extending parallel to the dummy word line DWL. At an end of each of the word lines WL0, WL1, . . . , a word line driver 2 that drives the word line WL is provided. The last stages of the word line drivers 2 are inverter circuits, each of which is formed by serially connecting current paths of a PMOS transistor Q21 that is a first transistor of a first conductivity type and an NMOS transistor Q22 that is a second transistor of a second conductivity type. Here, the length of the partial dummy word line DWLa is almost the same as that of the word line WL and the length of the partial dummy word line DWLb is almost the same as that of a wiring area A, in which the plurality of word line drivers 2 are arranged, in the direction of the bit lines BL.

Here, regarding the word line drivers 2 in FIG. 4, only the inverter circuits as their last stages are shown. A source of the PMOS transistor Q21 of the word line driver 2 that drives the word line WL0 is directly connected to the partial dummy word line DWLa. On the other hand, a source of the PMOS transistor Q21 of the word line driver 2 that drives the word line WL1 is connected through a DWLb0 that is a part of the partial dummy word line DWLb and has a parasitic capacitance Cdb0. In other words, the word line drivers 2 that drive word lines WLi (i=1 to n−1) are connected through the DWLb0 to a DWLbn−1 that are parts of the partial dummy word lines DWLb and a parasitic capacitance of the word line drivers 2 is a combined capacitance of Cdb0 to Cdbn−1.

Also, this semiconductor storage device includes PMOS transistors Q11 that are the switch circuits 1 each having a drain connected to each of the sources of the PMOS transistors Q21 of the word line drivers 2. All PMOS transistors Q11 are subjected to on/off control by a charge share starting signal CS which is commonly provided thereto. The sources of all PMOS transistors Q11 extend in a direction of the partial dummy word line DWLb and commonly connected to the replica line RL having a parasitic capacitance Cr which is almost the same as the parasitic capacitance Cdb. Here, because the partial dummy word line DWLb and the replica line RL have the same parasitic capacitance distribution, both of the lines existing between a specific position and another specific position in the direction of the bit lines BL have the same parasitic capacitance.

Further, this semiconductor storage device includes replica drivers 3 each of which is connected to the source of each of the PMOS transistors Q11 that are the switch circuits 1. Each of these replica drivers 3 has a source and a drain connected to each other and includes a fourth transistor Q31 of a PMOS type which is controlled together with the word line drivers 2 by a word line selecting signal WS. The replica driver 3 is configured to have a parasitic capacitance almost the same as those of the word line drivers 2. The parasitic capacitances of the word line drivers 2 and the replica driver 3 can be the same by making a width ratio between the gates of the PMOS transistors Q21 and Q31 be 2:1.

In the configuration as described above, the switch circuit 1 is not limited to the PMOS transistor but may be any element having a switching function such as an NMOS transistor.

Next, an operation upon selection of a word line WL in the circuit shown in FIG. 4 will be described.

The level of the dummy word line DWL is charged to the voltage Vdd before selecting the word line WL as described above. In this state, a specific word line driver 2 and a specific replica driver 3 are activated by the word line selecting signal WS. At this time, the switch circuit 1 arranged between the selected word line driver 2 and the selected replica driver 3 is activated by the charge share starting signal CS. In this case, the parasitic capacitance Cda of the partial dummy word line DWLa, the parasitic capacitance Cw of the word line WL, the parasitic capacitances Cr of the partial dummy word line DWLb and the replica line RL, the parasitic capacitance of the word line driver 2, and the parasitic capacitance of the replica driver 3 are equal to one another, so that the level of the selected word line WL becomes 1/2×Vdd as a result of the charge share.

With the configuration as described above, the parasitic capacitance Cdb of the partial dummy word line DWLb varying according to a position of the selected word line WL can be offset by the parasitic capacitance Cr of the replica line RL. Therefore, the voltage of 1/2×Vdd can be generated for the word line WL at any position.

Consequently, there is no need to adjust for each of the word lines WL, and thus, the cost can be reduced.

Further, with such a circuit configuration, it is easy to cope with changes in size of the memory cell array.

Specifically, when the size of the memory cell array is changed in the direction of the word lines WL, the parasitic capacitance Cda can be the same as the parasitic capacitance Cw of the word line WL by changing the length of the partial dummy word line DWLa to that of the word line WL. Also, it is possible to cope with changes in the size of the memory cell array in the direction of the bit lines BL only by changing the lengths of the partial dummy word line DWLb and the replica line RL to almost the same as those of the bit lines BL and /BL.

From this fact, the circuit configuration is considered to be highly flexible with respect to changes in the size of the memory cell array.

Figure 5:
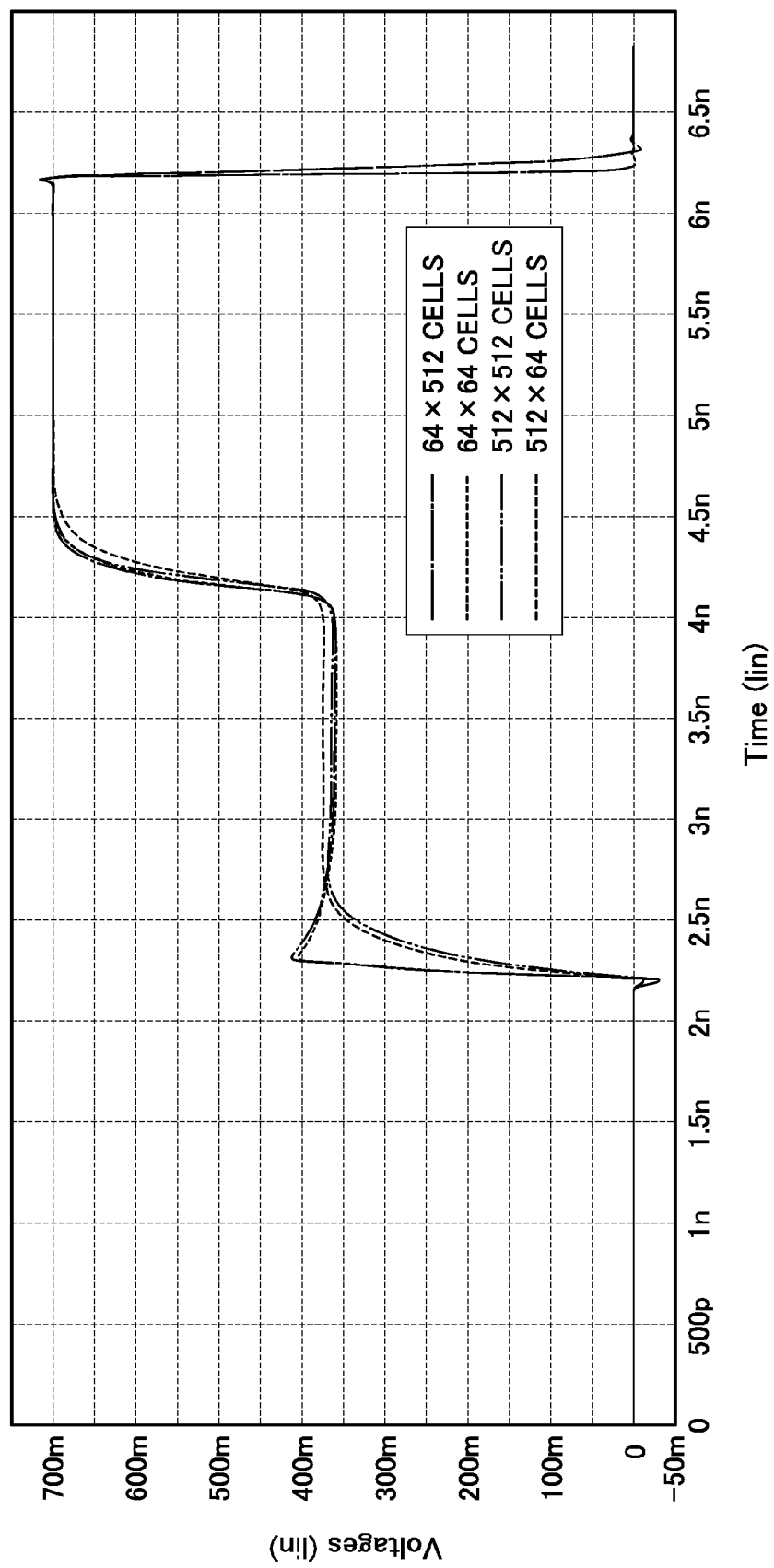
FIG. 5 shows simulation results of operation waveforms of a word line of the semiconductor storage device.
Figure 6:
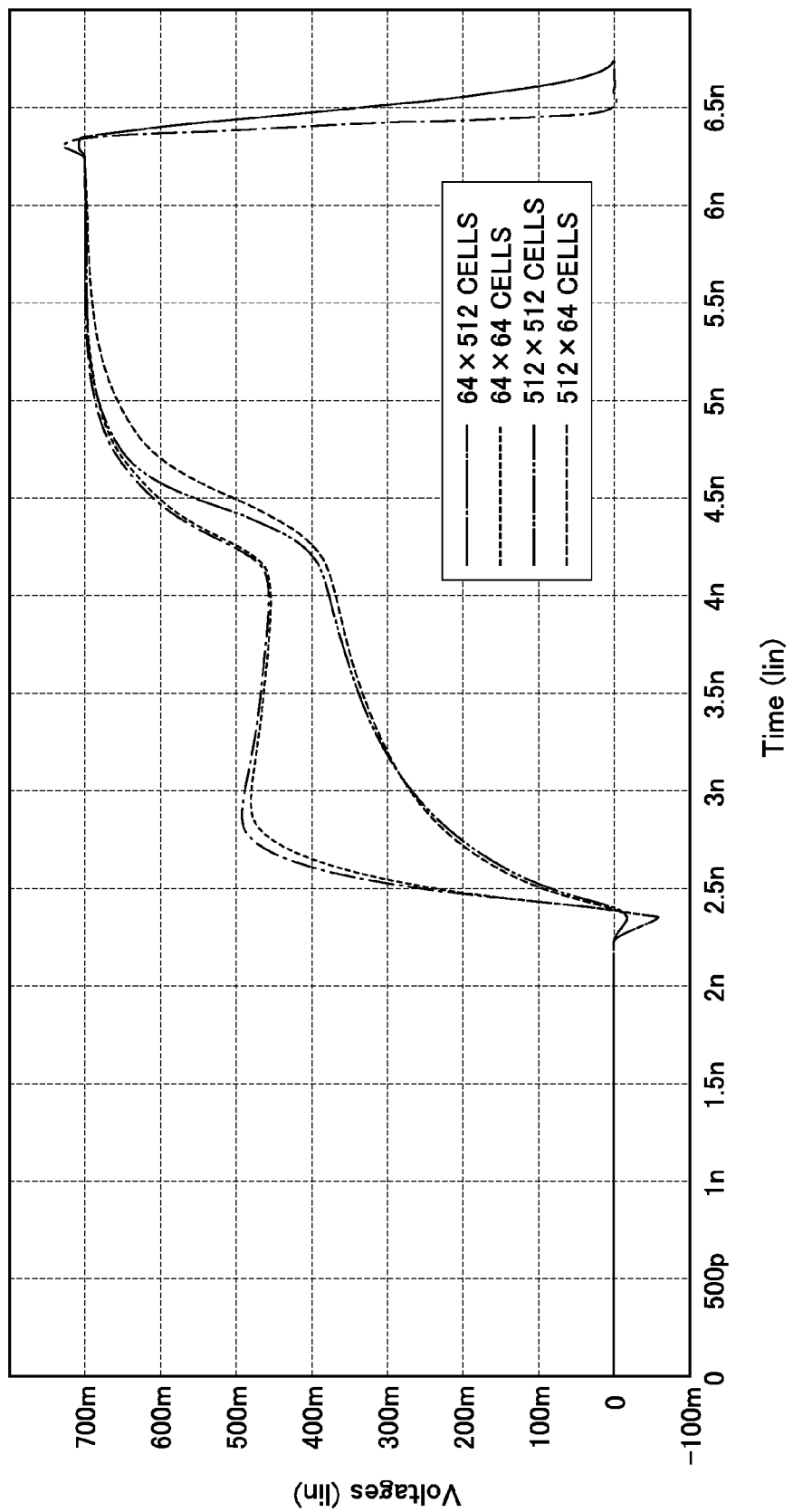
FIG. 6 shows simulation results of operation waveforms of a word line of the semiconductor storage device.

FIGS. 5 and 6 respectively show simulation results of operation waveforms of a word line WL in different design conditions of the transistors and with different sizes of the memory cell array.

FIG. 5 shows simulation results obtained when using high-speed transistors as the switch circuits 1. A dashed-dotted line is a simulation result of a memory cell array having 64 memory cells in the direction of the word lines WL and 512 memory cells in the direction of the bit lines BL. Similarly, a dotted line, a dashed-two dotted line and a dashed line are simulation results of memory cell arrays having memory cells of 64×64, memory cells of 512×512, and memory cells of 512×64, respectively. In FIG. 5, the voltage Vdd is set to 700 mV.

As can be seen from FIG. 5, a voltage of 350 mV, which is 1/2×Vdd, is generated in all memory cell arrays. It can also be seen that almost the same operation waveform is obtained independently of the scales of the memory cell arrays except that a slight overshoot is seen at the rising of the level of the word line WL (around time of 2.2n) in memory cell arrays having smaller number of memory cells in the direction of the word lines WL.

FIG. 6 shows simulation results obtained when using low-speed transistors as the switch circuits 1 included in the semiconductor integrated storage circuit according to this embodiment.

A rising time from "L" of the memory cell array having 64 memory cells in the direction of the word lines WL differs from that of the memory cell array having 512 memory cells in the direction of the word lines WL. More specifically, the voltage rises more gradually in the memory cell array having 512 memory cells in the direction of the word lines WL. However, it can be seen that the voltage of 350 mV, which is 1/2×Vdd, is generated in the memory cell arrays of all sizes. It can also be seen that the size difference in the direction of the bit lines BL has little influence on the operation waveform of the word line WL.

Consequently, a semiconductor storage device realizing a selection level of a word line in stages with a simple circuit configuration capable of flexibly coping with every memory cell array can be provided according to this embodiment.

[Second Embodiment]

A semiconductor storage device according to a second embodiment of this invention is obtained by using PMOS transistors, which respectively have the same characteristics as the PMOS transistors Q21 of the word line drivers 2, as the PMOS transistors Q11 that are the third transistors of the first conductivity type of the switch circuits 1 in the semiconductor storage device according to the first embodiment.

As described above, the memory cell MC can hold data more securely upon the data read by making the operation waveform of the word line WL in stages. In the operation waveform of the word line WL, the rising part depends on a relationship between the driving forces of the PMOS transistor Q21 of the word line driver 2 and the switch circuit 1.

Therefore, in order to make the operation waveforms of the respective word lines WL uniform, the word line drivers 2 and the switch circuits 1 associated with the respective word lines WL are required to have the same characteristics.

However, practically, the characteristics of the transistors constituting the word line drivers 2 vary, and thus a problem occurs.

In this respect, since the switch circuits 1 are formed using PMOS transistors having the same driving forces as the PMOS transistors Q21 of the word line drivers corresponding to the respective word lines WL, process variations of the transistors can be compensated according to this embodiment.

In addition, if the PMOS transistors Q21 of the word line drivers 2 corresponding to the respective word lines WL and the PMOS transistors Q11 of the switch circuit 1 are respectively formed continuously, these PMOS transistors Q21 and Q11 can have the same characteristics.

[Other Embodiments]

Although the embodiments of the invention have been described above, this invention is not limited to the above embodiments, and various modifications and additions are possible without departing from the scope and spirit of the invention.

For example, the level of the word line WL can be adjusted to any level other than 1/2×Vdd by changing respective ratios between the parasitic capacitance Cw of the word lines WL and the parasitic capacitance Cda of the partial dummy word line DWLa, between the parasitic capacitance Cdb of the partial dummy word line DWLb and the parasitic capacitance Cr of the replica line, and between the parasitic capacitances of the word line drivers 2 and the parasitic capacitance of the replica driver 3.

What is claimed is:

1. A semiconductor storage device comprising:
    a memory cell array comprising a plurality of first wirings, a plurality of second wirings across the first wirings, and a plurality of memory cells at intersections of the first and second wirings;
    a plurality of drivers configured to drive the first wirings;
    a dummy wiring along with a direction of the first wirings and a direction of the second wirings, a portion of the dummy wiring in the direction of the second wirings being connected to the plurality of drivers;
    a plurality of switching circuits connected to the connected portions of the plurality of drivers and the dummy wiring; and
    a replica line extending in the direction of the second wirings and connected to the dummy wiring through the plurality of switching circuits.

2. The semiconductor storage device of claim 1, further comprising a plurality of replica drivers connected to the drivers through the switching circuits.

3. The semiconductor storage device of claim 1, wherein the drivers comprise:
    first transistors of a first conductivity type comprising sources connected to the dummy wiring and drains connected to the first wirings; and
    second transistors of a second conductivity type comprising sources connected to a ground line, drains connected to the drains of the first transistors, and gates connected to the gates of the first transistors.

4. The semiconductor storage device of claim 1, wherein the switching circuits comprise third transistors of a first conductivity type.

5. The semiconductor storage device of claim 1, wherein
    a portion of the dummy wiring extending in the direction of the first wirings comprises a length substantially the same as a length of the first wirings, and
    the portion of the dummy wiring extending in the direction of the second wirings comprises a length substantially the same as lengths of a wiring area in the direction of the second wirings, the wiring area comprising the plurality of drivers.

6. The semiconductor storage device of claim 1, wherein the parasitic capacitance of the portion of the dummy wiring extending in the direction of the second wirings and the parasitic capacitance of the replica line comprise substantially the same distribution.

7. A semiconductor storage device comprising:
    a memory cell array comprising a plurality of word lines, a plurality of bit line pairs across the word lines comprising a plurality of first and second bit lines, and a plurality of memory cells at intersections of the word lines and the bit line pairs;
    a plurality of drivers configured to drive the word lines;
    a dummy wiring along with a direction of the word lines and a direction of the bit line pairs, a portion of the dummy wiring extending in the direction of the bit line pairs being connected to the plurality of drivers;
    a plurality of switching circuits connected to the connected portions of the plurality of drivers and the dummy wiring; and
    a replica line extending in the direction of the bit line pairs and connected to the dummy wiring through the plurality of switching circuits, wherein the memory cells comprise:

first and second inverters comprising input ends and output ends connected to each other;

first transfer transistors connected between the output ends of the first inverter and the first bit lines, and comprising gates connected to the word lines; and second transfer transistors connected between the output ends of the second inverter and the second bit lines and comprising gates connected to the word lines.

8. The semiconductor storage device of claim 7, further comprising a plurality of replica drivers connected to the drivers through the switching circuits.

9. The semiconductor storage device of claim 7, wherein the drivers comprise:

first transistors of Positive-Metal Oxide Semiconductor (PMOS) type comprising sources connected to the dummy wiring, and drains connected to the word lines; and second transistors of Negative-Metal Oxide Semiconductor (NMOS) type comprising sources connected to a ground line, drains connected to the drains of the first transistors, and gates connected to the gates of the first transistors.

10. The semiconductor storage device of claim 7, wherein the switching circuits comprise third transistors of PMOS type.

11. The semiconductor storage device of claim 7, wherein a portion of the dummy wiring extending in the direction of the word lines comprise a length substantially the same as length of the word lines, and the portion of the dummy wiring extending in the direction of the bit line pairs comprise a length substantially the same as a length of a wiring area in the direction of the bit line pairs, the wiring area comprising the plurality of drivers.

12. The semiconductor storage device of claim 9, wherein the replica drivers comprise fourth transistors of PMOS type comprising sources and drains connected to the replica line.

13. The semiconductor storage device of claim 7, wherein the parasitic capacitance of the portion of the dummy wiring extending in the direction of the bit line pairs and the parasitic capacitance of the replica line comprise substantially the same distribution.

14. The semiconductor storage device of claim 7, wherein one of the switching circuits connected to a predetermined one of the word lines is turned on after the dummy wiring becomes at a selective level and when the word line is selected, while writing data to the memory cells.

* * * * *